(12) United States Patent
Carpenter et al.

(10) Patent No.: US 7,230,512 B1
(45) Date of Patent: Jun. 12, 2007

(54) WAFER-LEVEL SURFACE ACOUSTIC WAVE FILTER PACKAGE WITH TEMPERATURE-COMPENSATING CHARACTERISTICS

(75) Inventors: Charles Carpenter, Orlando, FL (US); Jack Chocola, Lake Mary, FL (US); Kevin K. Lin, Orlando, FL (US); Phillip Welsh, Maitland, FL (US)

(73) Assignee: Triquint, Inc., Orlando, FL (US)

( * ) Notice: Subject to any disclaimer, the term of this patent is extended or adjusted under 35 U.S.C. 154(b) by 0 days.

(21) Appl. No.: 10/921,479

(22) Filed: Aug. 19, 2004

Related U.S. Application Data

(60) Provisional application No. 60/496,230, filed on Aug. 19, 2003.

(51) Int. Cl.
  *H03H 9/00* (2006.01)
  *H03H 9/10* (2006.01)
(52) U.S. Cl. .................................. 333/193; 333/133
(58) Field of Classification Search ............. 333/133, 333/193, 313 R, 344
  See application file for complete search history.

(56) References Cited

U.S. PATENT DOCUMENTS

| | | | |
|---|---|---|---|
| 5,420,472 A * | 5/1995 | Cho et al. | 310/344 |
| 5,525,855 A * | 6/1996 | Gotoh et al. | 310/344 |
| 5,998,907 A | 12/1999 | Taguchi et al. | |
| 6,225,692 B1 | 5/2001 | Hinds | |
| 6,310,425 B1 | 10/2001 | Tanaka | |
| 6,445,265 B1 * | 9/2002 | Wright | 333/193 |
| 6,495,383 B2 | 12/2002 | Lyu | |
| 6,495,398 B1 | 12/2002 | Goetz | |
| 6,498,387 B1 | 12/2002 | Yang | |
| 6,500,694 B1 | 12/2002 | Enquist | |
| 6,507,097 B1 | 1/2003 | Goetz et al. | |
| 6,621,379 B1 | 9/2003 | Goetz et al. | |
| 6,627,531 B2 | 9/2003 | Enquist | |
| 6,635,509 B1 | 10/2003 | Ouellet | |
| 6,639,150 B1 | 10/2003 | Goetz et al. | |
| 6,660,564 B2 | 12/2003 | Brady | |
| 6,734,605 B2 * | 5/2004 | Kinoshita | 310/348 |
| 6,852,561 B2 * | 2/2005 | Bidard et al. | 438/50 |
| 6,928,718 B2 * | 8/2005 | Carpenter | 29/594 |

OTHER PUBLICATIONS

T. Glinsner, V. Dragoi, C. Thanner, G. Millendorfer, P. Lindner, C. Schaeffer; Wafer Bonding Using BCB and SU-8 Intermediate Layers for MES Applications; pp. 1-4; Presented at SEMICON Taiwan; 2002.

(Continued)

*Primary Examiner*—Dean Takaoka
(74) *Attorney, Agent, or Firm*—Allen, Dyer, Doppelt, Milbrath & Gilchrist, P.A.

(57) ABSTRACT

A SAW filter is fabricated at a wafer level for providing desirable temperature characteristics. The filter includes a piezoelectric substrate bonded to a carrier substrate, wherein the coefficient of thermal expansion of the carrier substrate is less than the coefficient of thermal expansion of the piezoelectric substrate. Interdigital transducers are formed on the piezoelectric substrate so as to form a SAW composite die structure. A cap substrate having a coefficient of thermal expansion similar to that of the carrier substrate is bonded to the SAW composite die structure for enclosing the interdigital transducers. Plated vias form signal pad interconnects to input and output pads of the interdigital transducer and a sealing pad formed on the surface of the piezoelectric substrate bonds the SAW composite die structure to the cap substrate.

25 Claims, 12 Drawing Sheets

OTHER PUBLICATIONS

Frank Niklaus, Peter Enoksson, Edvard Kalvesten, Goran Stemme; "Low-Temperature Full Wafer Adhesive Bonding"; Journal of Micromechanics and Microengineering; Mar. 28, 2000; pp. 100-107.

* cited by examiner

TEMPERATURE SHIFT COMPARISON

| SPECIFICATION | FLIP CHIP | | CHIP AND WIRE | |
|---|---|---|---|---|
| | NO TEMP COMP | TEMP COMP | TEMP COMP | NO TEMP COMP |
| 8.0dB_UF | 42.55 | 31.29 | 30.38 | 57.09 |
| 8.0dB_LF | 40.31 | 21.39 | 14.30 | 38.53 |
| 20_dB_UF | 43.62 | 32.09 | 28.61 | 55.08 |
| 20_dB_LF | 37.72 | 19.92 | 17.14 | 42.08 |

ALL DATA IN PPM

*FIG. 1*

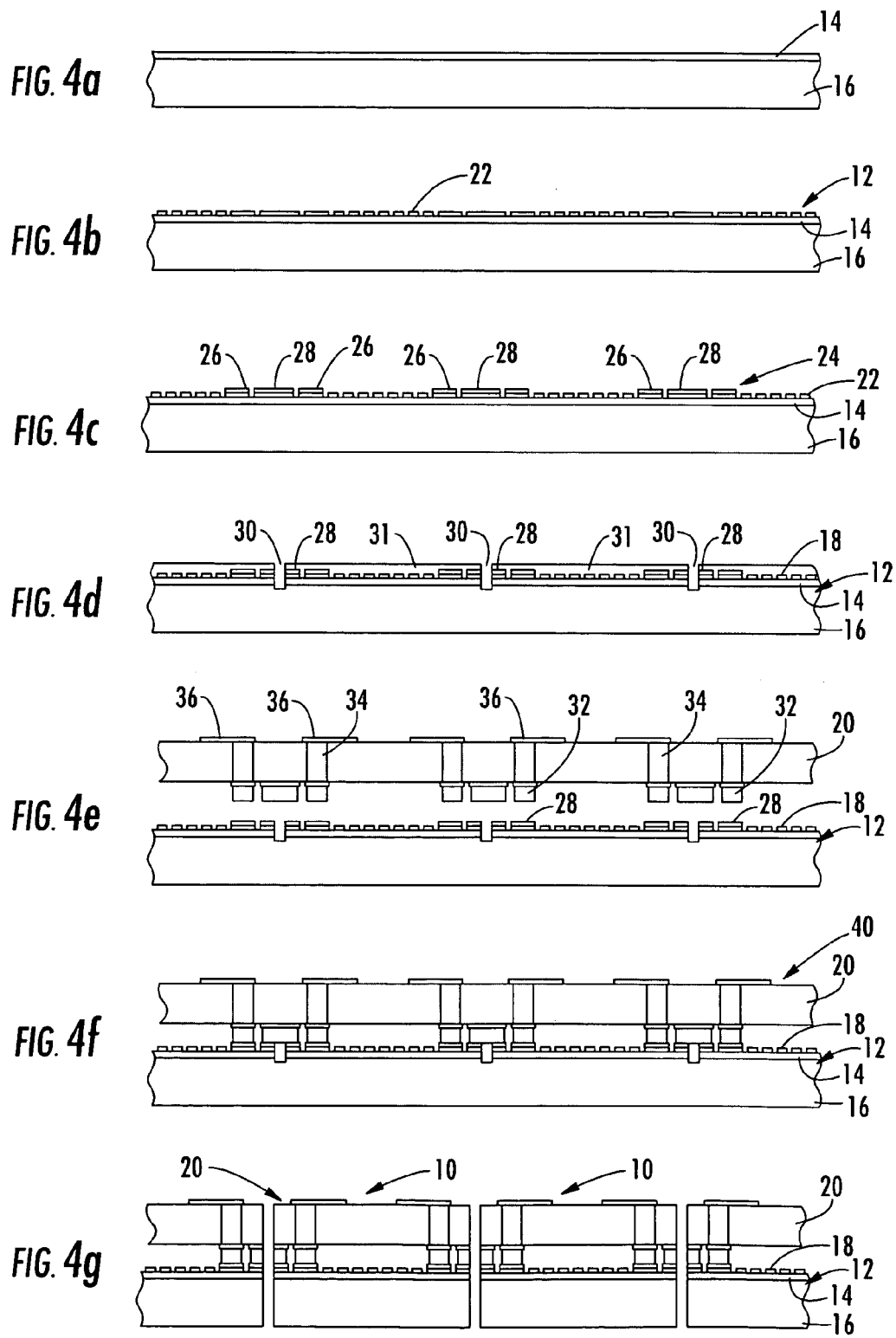

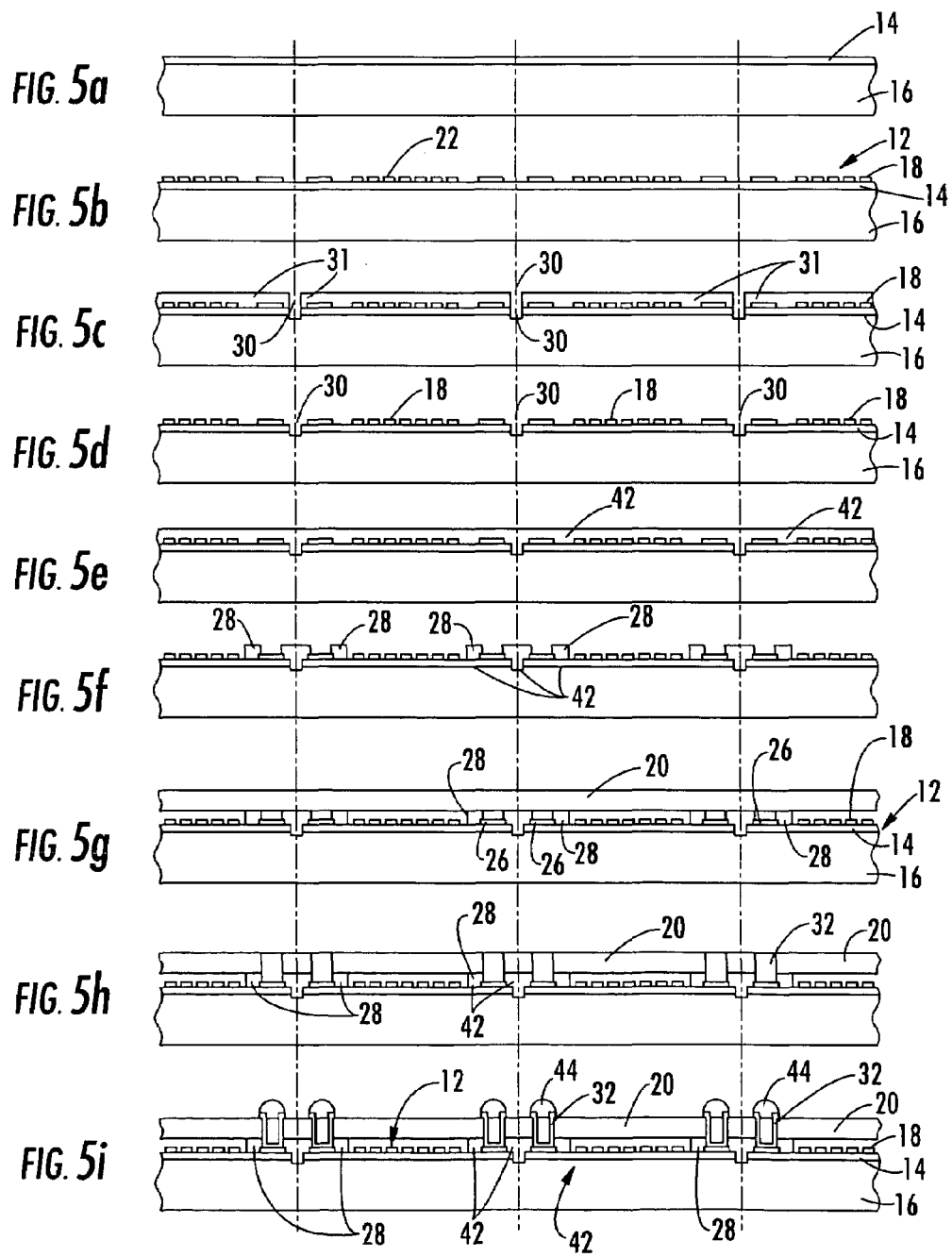

WAFER-LEVEL SURFACE ACOUSTIC WAVE FILTER PACKAGE WITH TEMPERATURE-COMPENSATING CHARACTERISTICS

CROSS-REFERENCE TO RELATED APPLICATIONS

This application claims the benefit of U.S. Provisional Application No. 60/496,230, filed Aug. 19, 2003, of which is hereby incorporated herein in its entirety by reference.

FIELD OF THE INVENTION

The present invention relates to surface acoustic wave devices useful for applications in wireless communications.

BACKGROUND OF THE INVENTION

Surface Acoustic Wave (SAW) devices, on account of their small size, low cost and ease of mass production, have been widely accepted in many applications such as cellular phones, wireless LANs, and cellular base stations. Typically, a SAW device includes transducers and/or reflectors disposed on a surface of a piezoelectric substrate. FIG. 1a illustrating a typical SAW resonator filter comprising transducers and reflectors. The transducers, composed of metalized interdigitated electrodes, are used for the generation and detection of surface acoustic waves. The electrode widths and spacing determine the frequency characteristics of the SAW filter. Lithium Tantalate and Lithium Niobate piezoelectric substrates are commonly used for the manufacturing of SAW devices. The strong coupling characteristics of these piezoelectric substrates provide a very desirable substrate for which low insertion loss and large fractional bandwidth SAW filters can be designed. However, both substrates exhibit high temperature drift by way of example, a 64° YX cut Lithium Niobate would typically exhibit about 70 ppm/° C. shift while a 46° cut Lithium Tantalate (LT) would shift about 50 ppm/° C. Thus, for a PCS hand phone that operates at a center frequency of about 1.9 GHz and over a temperature range of 100° C. would result in a frequency shift of about 14 MHz for Lithium Niobate and 9.5 MHz for Lithium Tantalate. This high frequency drift would preclude some of the SAW applications that may require a very steeply shaped frequency response. A proven technique for limiting the temperature drift of a SAW filter is to bond a thin layer of Lithium Tantalate or Lithium Niobate to a low coefficient thermal expansion carrier substrate like Si or Glass as disclosed by Taguchi et al in U.S. Pat. No. 5,998,907. The combined structure of the SAW metallized pattern on the surface of a piezoelectric substrate mounted on a carrier substrate (also designated as surrogated substrate) is referred to as a "composite SAW die." FIG. 1b illustrates a composite SAW die in which the piezoelectric wafer is bonded directly on carrier substrate while FIG. 1c depicts a composite die structure with the piezoelectric substrate bonded to the carrier through a catalytic bonding layer. Si has a coefficient of thermal expansion (CTE) of about 2.6 ppm/° C. and that of Lithium Tantalate is about 16 ppm/° C. The relatively low CTE silicon constrains the high CTE Lithium Tantalate during thermal excursions thus limiting the temperature drift of the filter response. The composite bonded die structures typically are mounted in packages using conventional chip and wire methods as illustrated in FIG. 2a. Bonded wires form the electrical interconnects from the SAW device pattern to the signal pads of the package. Signal pads are connected either to the input transducer, output transducer or ground pad of the SAW device. Chip and wire SAW packages have a disadvantage in that they require a certain amount of space clearance for bonding wire to the package signal pads. In quest of miniaturization, the SAW die can be mounted in a flip chip configuration as illustrated in FIG. 2b. Here, the die is mounted in a face down manner connecting the SAW pattern structure directly to the signal pads of the package, thereby eliminating the need for wire bonding. Typically, flip chip SAW devices exhibit a much lower height and smaller size profile than the chip and wire SAW devices and thus are generally preferred.

FIGS. 3a and 3b illustrate, by way of example, temperature characteristics of an 1880 MHz SAW composite filter for a chip and wire ceramic package and a flip chip type package respectively. The three curves represent the frequency responses approximately at −20° C., 25° C. and 70° C. respectively. FIG. 1 identifies an average temperature drift of the conventional (no temperature compensation) and composite (temperature compensated) SAW filters for both package types. It is clear from the table of FIG. 1 that the composite SAW device for both the chip and wire and flip chip are significantly improved compared to the conventional SAW filters. Typically, for conventional non-temperature compensated SAW filter, it is expected that the temperature drift for the flip chip SAW filter behaves better than that of the chip and wire device as is shown in the Table. Thus, it is expected that the flip chip composite SAW filter exhibit better temperature characteristics than the composite chip and wire device.

However, an unexpected result was discovered. The flip chip composite SAW filter exhibits a higher temperature drift than that of the composite chip and wire device. In particular, the temperature drift at the lower 8 dB frequency point shows approximately 8 ppm/° C. worse and the 20 dB frequency point shows approximately about 3 ppm/° C. worse. By way of example, for mobile telephone applications, a 3 ppm/° C. would translate into an additional frequency drift of approximately greater than 0.5 MHz which is very significant. It was discovered that a key disadvantage of a flip chip package attaching these bonded composite structures to ceramic packages is that the intermediate CTE of the ceramic (7 ppm/° C.) reduces the amount of temperature compensation created by the silicon. Basically, the bonded die structure is rigidly attached to the ceramic package during flip-chip assembly. Since the ceramic expands at a greater rate than the silicon, the temperature compensation created by the thermal constraint of the silicon on the Lithium Tantalate is lower than expected. This is in direct contrast to chip and wire applications in which a low stress adhesive is typically used to attach the bonded die structures to the high temperature co-fired ceramic (HTCC) ceramic package. The adhesive effectively decouples the silicon from the HTCC and allows the silicon to properly constrain the planar expansion of the Lithium Tantalate during thermal excursions.

Thus, it is highly desirable to obtain a composite SAW die device that will exhibit low height profile and small size that can maintain good temperature characteristics of the temperature compensation of the composite SAW die. The composite SAW device should preferably be bond wire free. It is desirable to provide the teaching of techniques for packaging a composite SAW die bonded directly to a substrate that exhibits a low coefficient of thermal expansion. It is also desirable that the composite SAW device be capped by a substrate whose coefficient is very similar to that of the carrier substrate of the composite SAW die.

SUMMARY OF THE INVENTION

A SAW filter is fabricated for providing desirable temperature characteristics. The filter includes a piezoelectric substrate bonded to a carrier substrate, wherein the coefficient of thermal expansion of the carrier substrate is less than the coefficient of thermal expansion of the piezoelectric substrate. Interdigital transducers are formed on the piezoelectric substrate bonded on the carrier substrate so as to form a SAW composite die structure. A cap substrate having a coefficient of thermal expansion similar to that of the carrier substrate is bonded to the SAW composite die structure for enclosing the interdigital transducers. Signal pads formed on the cap substrate are connected to input and output pads of the interdigital transducer. Metallic or non-conductive sealing pads formed on the surface of the piezoelectric substrate bonds the SAW composite die structure to the cap substrate.

A method aspect of the invention may include manufacturing a wafer level packaged SAW filter by bonding a piezoelectric substrate to a carrier wafer formed of a material having a coefficient of thermal expansion that is significantly less than that of the piezoelectric substrate, patterning SAW transducers on a surface of the piezoelectric substrate to form a SAW die composite structure, applying a metallization layer on a surface of the piezoelectric substrate for defining a sealing pad, an input pad, and an output pad of the interdigital transducers, providing a cap wafer made of material having a coefficient of thermal expansion similar as the carrier substrate, patterning the cap wafer to form signal and sealing pads, bonding the SAW die composite structure to the capped wafer through the sealing pads, and connecting the signal pads of the capped substrate directly to at least one of the input and output pads of the interdigital transducers. Alternatively, a non-conductive sealing pad may be formed on the surface of the piezoelectric substrate to bond the SAW composite die structure to the cap substrate.

BRIEF DESCRIPTION OF THE DRAWINGS

Embodiment of the invention are described, by way of example, with reference to the accompanying drawings in which:

FIG. 1 is a table identifying an average temperature drift of a conventional SAW filter and a composite SAW filter;

FIG. 3b is plot illustrating frequency characteristics of a flip chip composite SAW filter operating at the same selected temperatures illustrated in FIG. 3a;

FIGS. 4a–4g illustrate steps in a fabricating process of wafer level packaging a composite SAW die structure for forming a miniaturized SAW filter illustrated with reference to FIG. 4 having desirable temperature compensation characteristics, wherein and by way of example, 4a includes bonding the Lithium Tantalate (LT) to silicon and thinning the LT, 4b includes applying a first level SAW device metallization, 4c includes applying a second level metallization (solderable) to input/output pads and perimeter seal pads, 4d includes applying a resist and dice through the LT and into the silicon wafer along a center of seal pads, 4e includes stripping a resist from the device wafer and aligning the patterned and plated silicon cap wafer to the device wafer, 4f includes a patterned silicon cap wafer bonding to the LT and silicon device wafer by reflowing solder in an inert atmosphere, and 4g includes a dicing through the bonded device to cut through or singulate and thus provide a discrete hermetically sealed wafer level package (WLP) SAW device;

FIGS. 5a–5i illustrate steps in a fabricating process of wafer level packaging a composite SAW die structure for forming a miniaturized SAW filter illustrated with reference to FIG. 5 having desirable temperature compensation characteristics, wherein and by way of example, 5a includes a bonding of LT to silicon and thinning of the LT, 5b includes applying a first level SAW device metallization, 5c includes applying a resist and dice through the LT and into the silicon wafer along a center of seal pads, 5d includes stripping a resist, 5e includes depositing and planarizing silicon dioxide, 5f includes etching the silicon dioxide layer above an active area and the input/output pads, 5g includes fusion bonding a silicon cap wafer to the device wafer, 5h includes etching vias through the silicon cap wafer, and 5i includes plating the vias and forming solder bumps.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

Figure 1A:
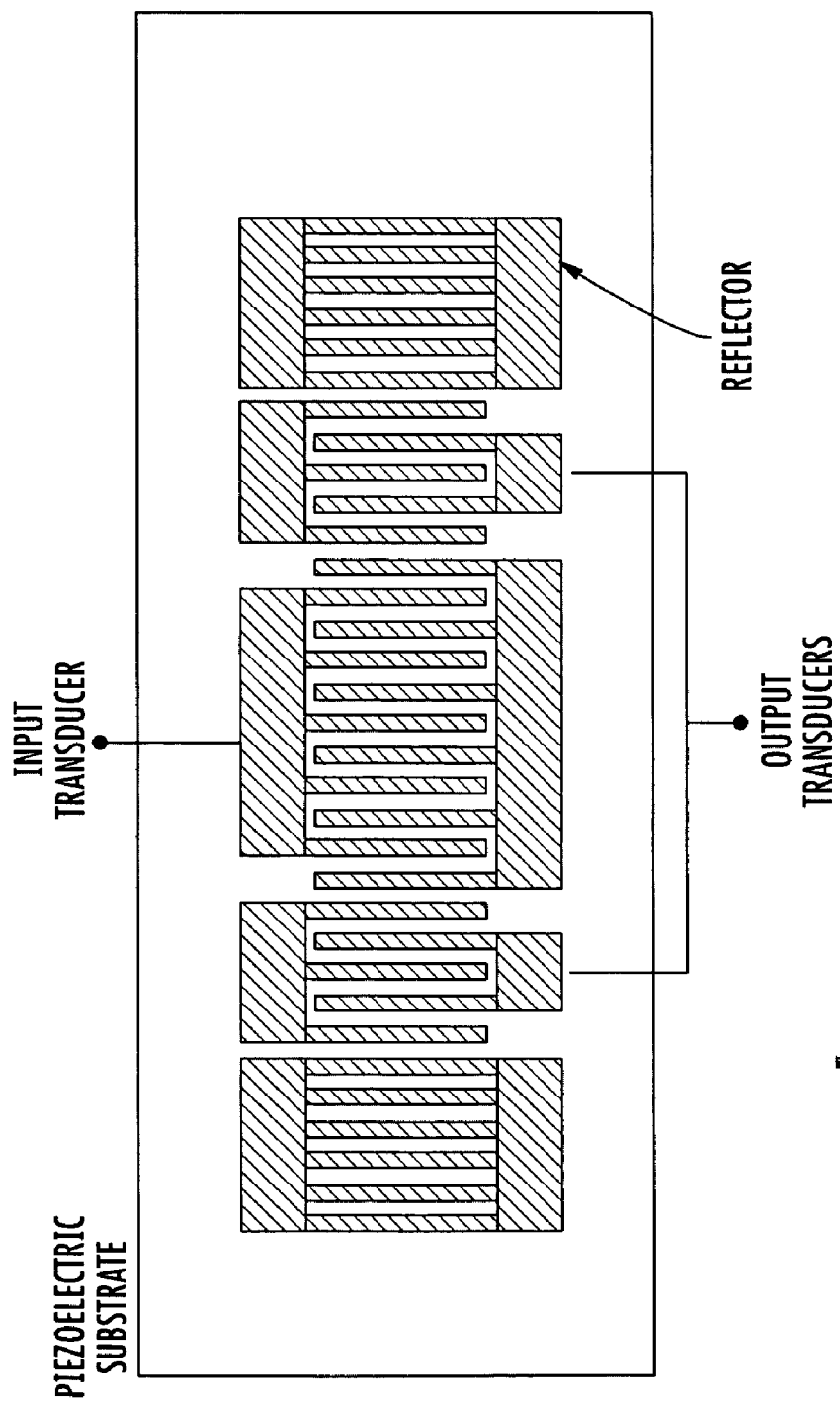
FIG. 1a is a partial plan view of a SAW die pattern on a piezoelectric substrate.
Figure 1B:
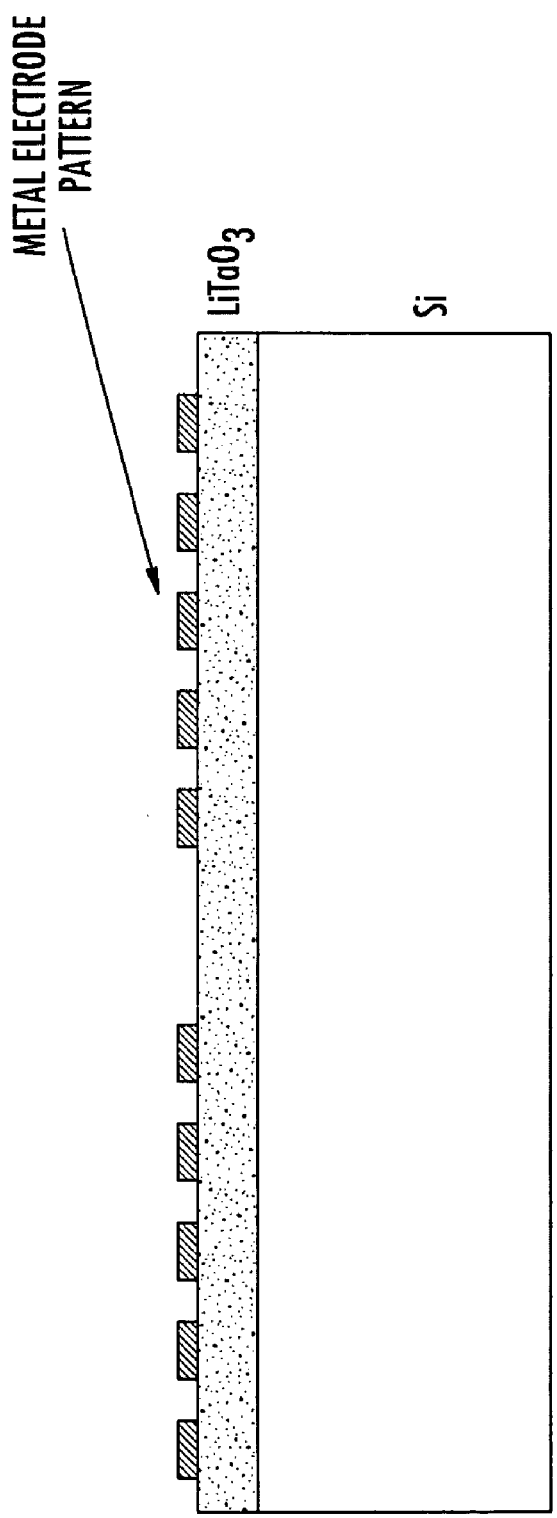
FIG. 1b is a partial elevation and cross-sectional view of a composite SAW die wherein a piezoelectric substrate layer is bonded to a carrier substrate of silicon.
Figure 1C:
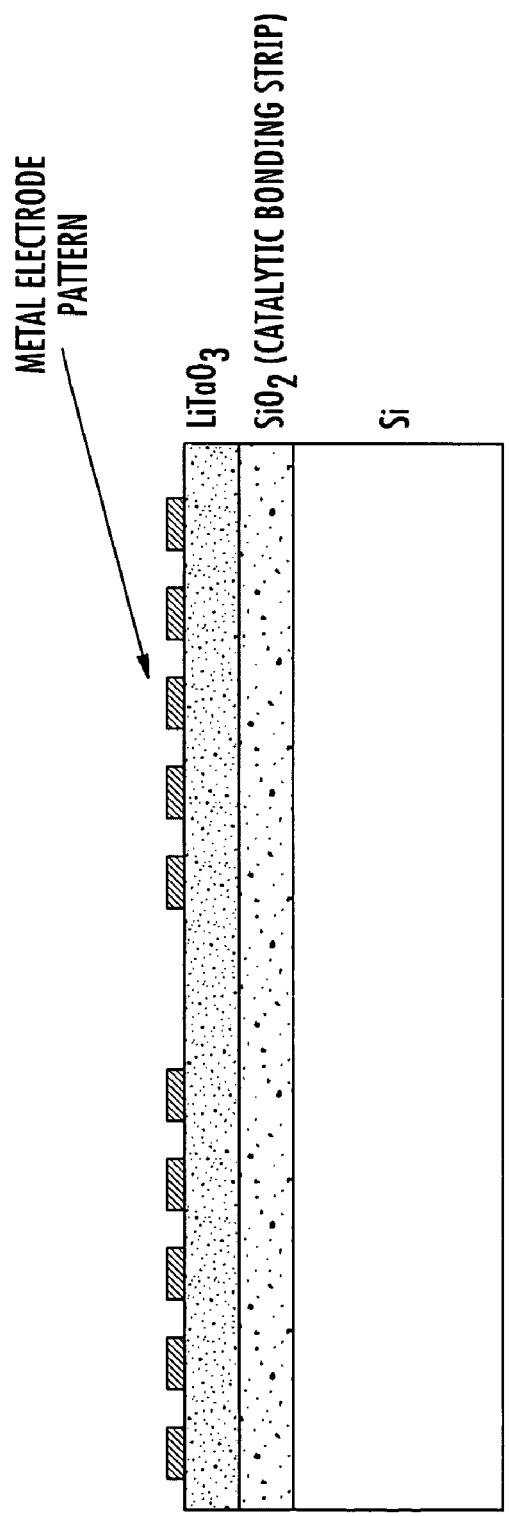
FIG. 1c is a partial elevation and cross-sectional view of a composite SAW die wherein a piezoelectric substrate layer is bonded to a carrier substrate through a catalytic bonding layer of silicon dioxide.
Figure 2A:
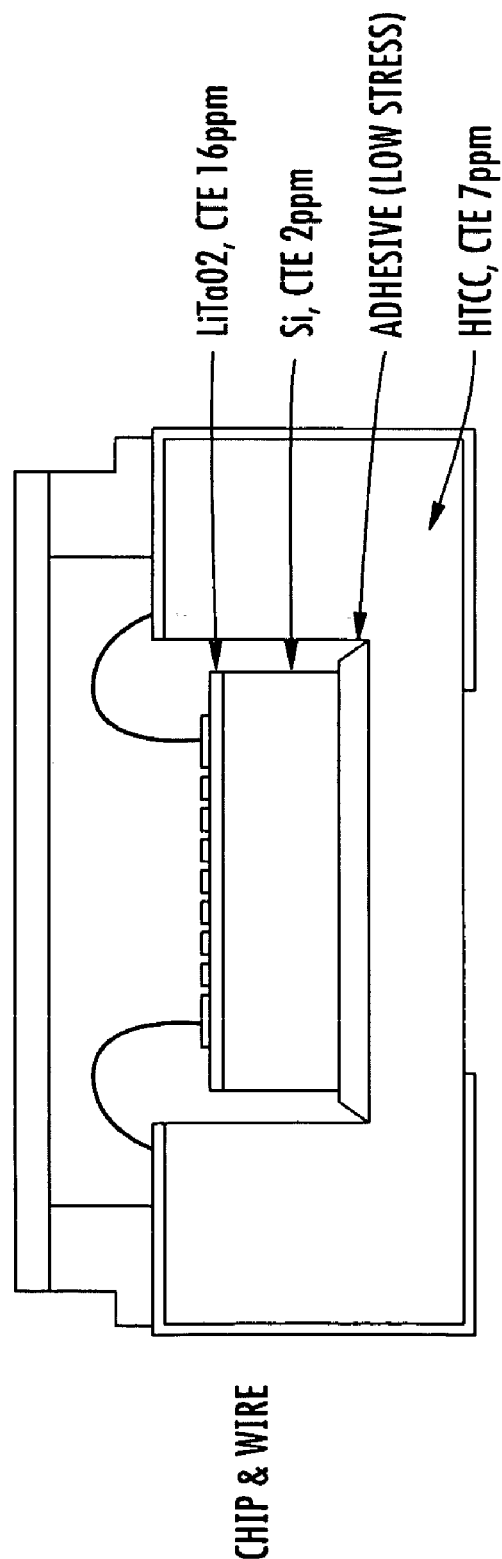
FIG. 2a is a partial elevation and cross-sectional view of a chip and wire composite filter structure.
Figure 2B:
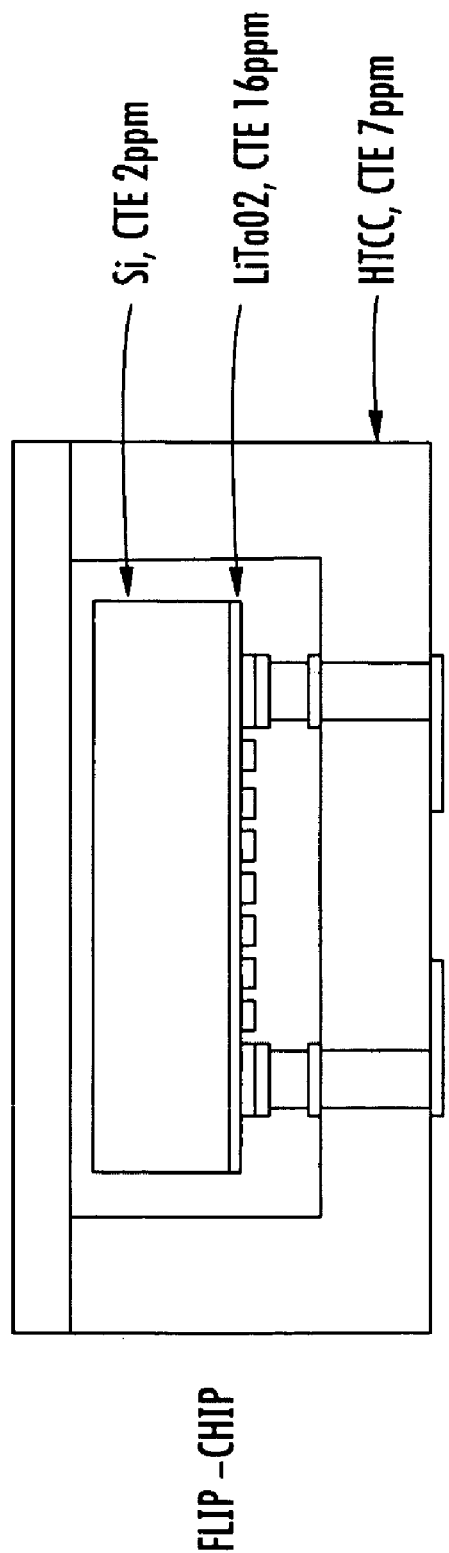
FIG. 2b is a partial elevation and cross-sectional view of a flip chip composite SAW filter structure.
Figure 3A:
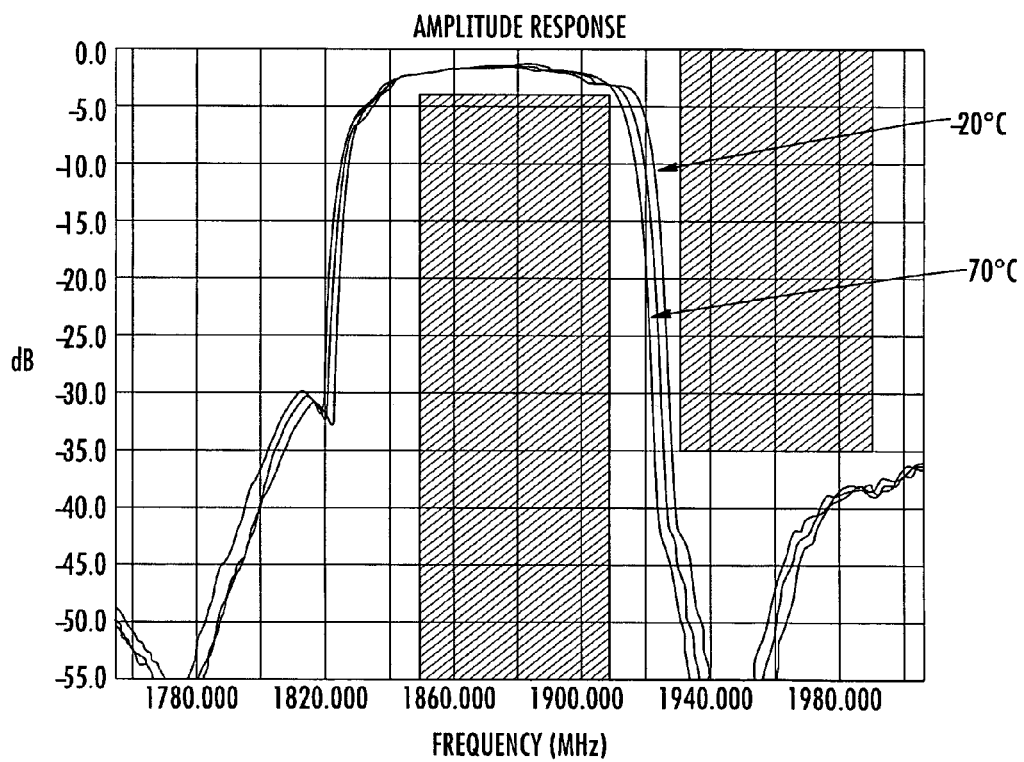
FIG. 3a is plot illustrating frequency characteristics of a chip and wire composite SAW filter operating at selected temperatures of approximately −20° C., 25° C., and 70° C., by way of example.
Figure 3B:
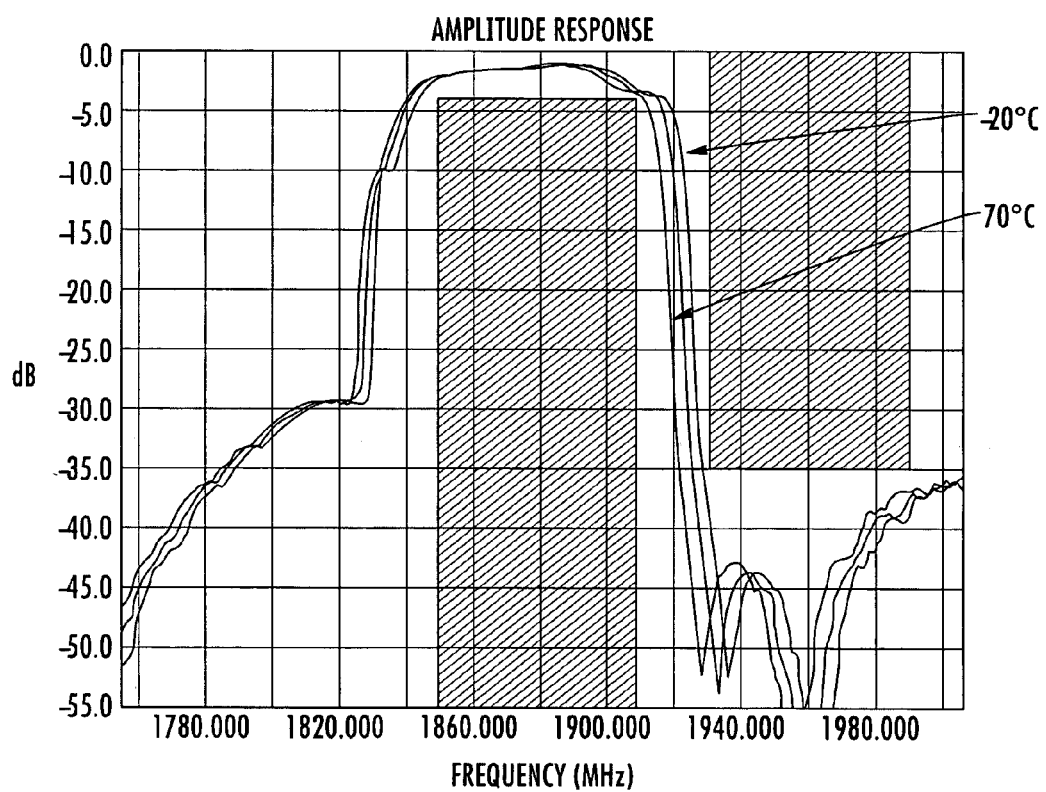
Figure 4:
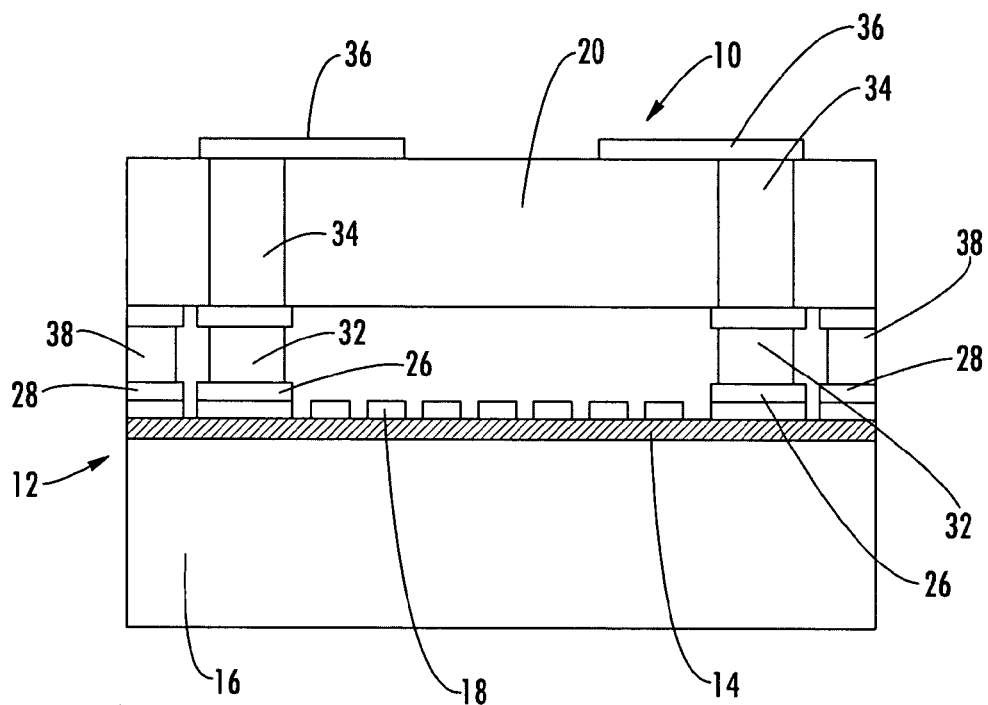
FIG. 4 is a partial cross-sectional elevation view of an embodiment of a SAW filter package fabricated including metallic bonding in keeping with the teachings of the present invention.
Figure 5:
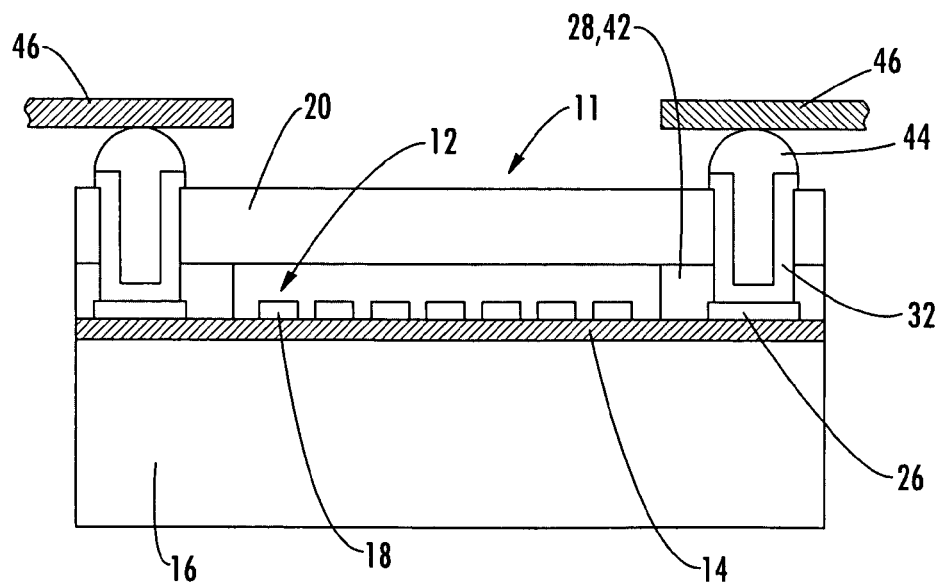
FIG. 5 a partial cross-sectional elevation view of an embodiment of a SAW filter package fabricated including fusion bonding in keeping with the teachings of the present invention.

Referring initially to FIGS. 4 and 5, first 10 and second 11 embodiments of a miniaturized SAW filter having temperature compensation characteristics are illustrated, by way of example. As herein described, the SAW filter 10, 11 includes a composite SAW die structure 12 formed by a combination of a piezoelectric substrate 14 bonded to a carrier substrate 16, wherein the coefficient of thermal expansion of the carrier substrate is less than the coefficient of thermal expansion of the piezoelectric substrate, and interdigital transducer pattern 18 carried on a surface 19 of the piezoelectric substrate. A cap substrate 20 is bonded to the composite SAW die structure 12 for enclosing the interdigital transducer pattern 18. The cap substrate 20 has a coefficient of thermal expansion similar to the coefficient of thermal expansion of the carrier substrate 16.

By way of example, and as herein described, the composite SAW die structure 12 may include a silicon material for the carrier substrate 16 and the cap substrate 20, with the piezoelectric substrate 14 being Lithium Tantalate for such packaging at a wafer level. For the embodiments herein described, the Lithium Tantalate piezoelectric substrate 14 is sandwiched between the silicon materials 16, 20 and thus does not suffer the degradation in temperature compensation as may be realized in a ceramic package for flip chip application, by way of example.

One teaching of the present invention includes the silicon substrates or wafers used to create the bonded die structures and thus allow the use of standard silicon wafer bonding techniques for creating hermetically sealed, wafer-level packages. Typically, such wafer packaging solutions involve high bonding temperatures that can create excessive thermal stress on substrates such as Lithium Tantalate. As will be further illustrated herein, embodiments of the present invention resolve this problem by partially singulating the bonded Lithium Tantalate structures, prior to bonding.

One method for producing an embodiment of the invention is illustrated with reference now to FIGS. 4a–4g. By way of example, and with reference to FIG. 4a, the piezoelectric substrate 14, Lithium Tantalate, may be bonded to the carrier substrate 16, Si, in a number of ways well known in the art. One method, by way of example, is described in U.S. Pat. No. 5,998,907, the disclosure of which is herein incorporated by reference, wherein both substrates are treated in a mixed solution of ammonium hydroxide and hydrogen peroxide rendering them hydrophyllic. The two substrates 14, 16 are then directly joined together by an intermolecular force of hydrogen and oxygen. The bond is then strengthened by thermal treatment at an elevated temperature. Another technique is described U.S. Pat. No. 6,627,531 and related patents, the disclosures of which are herein incorporated by reference, wherein the bonding of the piezoelectric substrate and the carrier substrate (Si) takes place through a catalytic bonding layer of $SiO_2$. The catalytic layer enables a room temperature bonding which has the advantage of reducing stress at the bonding boundary. The amount of temperature compensation depends upon the thickness of the piezoelectric substrate. A thinner piezoelectric substrate implies better temperature compensation. Thus, the piezoelectric substrate 14, Lithium Tantalate (LT), may be thinned after being bonded to the carrier substrate 16. Typically, the thickness of the piezoelectric substrate 14 can be thinned to less than five mils from a standard thickness of about 15 mils.

Figure 4H:
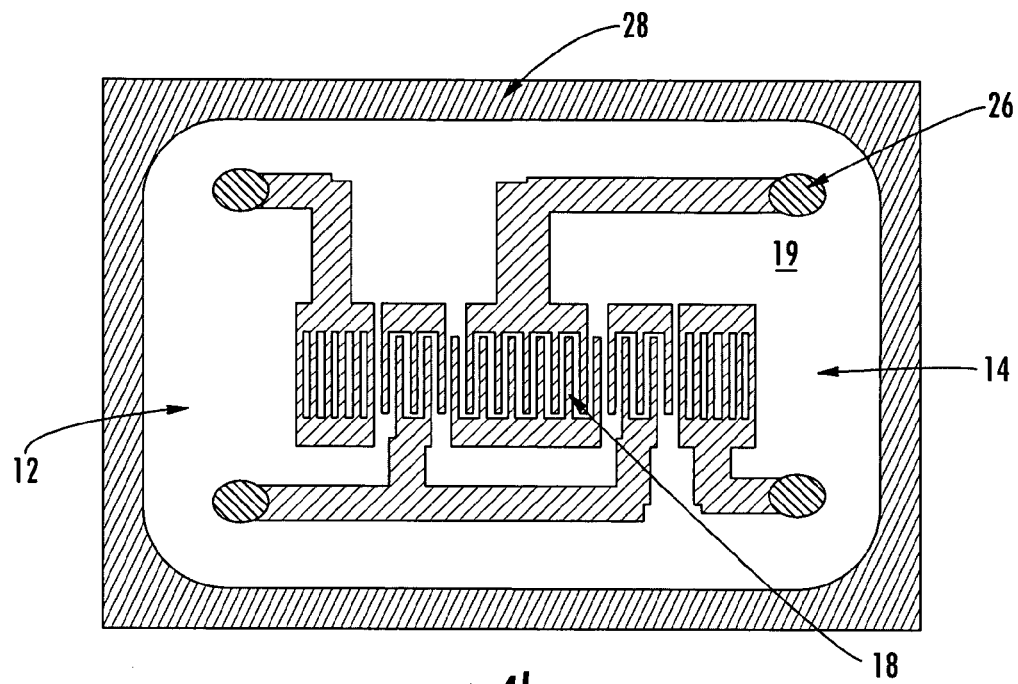
FIG. 4h is a partial top plan view of FIG. 4c illustrating a composite SAW die following a second metallization for including seal pad and signal pad interconnects, by way of example.

The bonded structure, illustrated with reference again to FIG. 4a, is then subjected to a fabrication process flow including, by way of example, metalization and photolithography to produce a SAW transducer die pattern 22, as illustrated with reference to FIG. 4b. The fabrication process of patterning the SAW die pattern 22 on a piezoelectric substrate is well known to those of skill in the art. The metallization process may include a second level of metal 24 that may be solderable, for example gold over Ni, as illustrated with reference to FIG. 4c. Such a second level 24 may define signal interconnection input/output pads 26 and the perimeter seal pads 28, as well as providing a height clearance to ensure the free propagation of surface acoustic waves along the active area of the transducers. With reference to FIG. 4h, a top view of a SAW composite die structure 12 after the $2^{nd}$ metallization layer process depicting the perimeter metallic seal, seal pads 28, and the signal pad interconnects, input/out pads 26 is illustrated by way of example. With reference now to FIG. 4d, the composite SAW die structure 12, also referred to a wafer may be partially singulated 30 after typically having a protective resist material 31, with the singulation being made along a center of the seal pads 28 and cut through the piezoelectric substrate 14. The composite SAW die structure 12 may now be bonded to the cap substrate 20. As earlier described, the capped material used for the cap substrate 20 may be similar to that of the carrier substrate 16 having a coefficient of thermal expansion approximately similar to that of the carrier substrate and generally having a relatively low coefficient of thermal expansion (CTE). The solderable seal pads 28 are defined around the perimeter of each die 12, as illustrated with reference again to FIG. 4h. As illustrated with reference to FIG. 4e, after removing the resist material 31 earlier described with reference to FIG. 4d, the signal connections forming the input/output pads 28 may be attached to plated vias 32 for connection to cap vias 34 and external signal pads 36 of the filter 10, with a plated solder seal 38 made with the seal pads 28, as illustrated with reference again to FIG. 4. As illustrated with reference to FIG. 4f, the above composite/combination may now be bonded to the patterned Si cap substrate/wafer 20 by reflowing the solder in an inert gas.

This process usually requires an elevated temperature and the structure would experience excessive thermal stress. Since the composite SAW die structure 12 is partially singulated, as above described, the thermal stress is alleviated by preventing an accumulative effect due to the differences in thermal coefficients of thermal expansions of the two substrates 14, 16. As illustrated with reference to FIG. 4g, the capped composite structure 40 of FIG. 4f may then be diced to form the completed SAW composite filter 10 as earlier illustrated with reference to FIG. 4. Since the SAW die pattern 22 is now directly connected to the signal pad 36 of a Si cap substrate 20 which has the same CTE as that of the carrier substrate 16, the improved temperature compensation characteristics is thus retained. The SAW composite filter 10 also exhibits a low height profile as it is free of bond wire interconnects, by way of example.

Figure 5J:
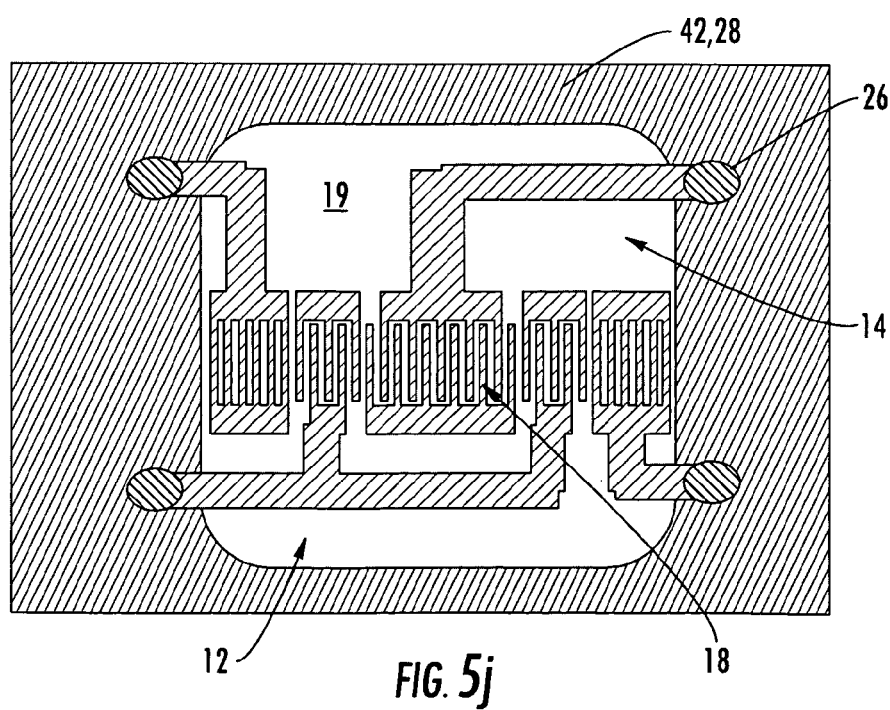
FIG. 5j is a partial top plan view of a composite SAW die illustrating silicon dioxide seal pad and signal pad interconnects, by way of example.

By way of continued example, the second embodiment 11 of the invention described earlier with reference to FIG. 5, is now presented in step processes as illustrated with reference to FIGS. 5a–5i. As earlier described, the piezoelectric substrate 14, Lithium Tantalate, is bonded to a low coefficient of thermal expansion substrate 16 such as the Si carrier substrate 16, as illustrated with reference to FIG. 5a, and is then subjected to a fabrication process flow which comprises metallization and patterning to form the SAW composite die structure 12, as illustrated with reference to FIG. 5b. The fabrication of SAW die patterns 22 on a piezoelectric substrate is well known to those of skill in the art. The composite SAW die structure 12 is then partially cut or sawed 30 after applying the protective resist material 31, as earlier described and as now described with reference to FIG. 5c, at about the center of the seal pads 28 and through the Lithium Tantalate piezoelectric substrate 14 to relieve thermal stress. As illustrated with reference to FIG. 5d, the protective resist material 31 is stripped off and the active area of the SAW die, the input/output connecting pads of the SAW transducers, and the seal pads, are defined through patterning of a electrically non-conducting $SiO_2$ material/layer 42 that includes depositing, planarizing and etching of $SiO_2$, as illustrated with reference to FIGS. 5d, 5e, and 5f. A deposition of the non-conducting layer of $SiO_2$ may be achieved through chemical vapor deposition, sputtering or an evaporation process. As illustrated with reference to FIG. 5e, planarizing of the $SiO_2$ layer 42 can be accomplished through chemical mechanical polishing (CMP). As illustrated with reference to FIG. 5f, etching of the $SiO_2$ layer 42 over the active area of the SAW composite die provides a clearance for the free propagation of the surface acoustic waves. FIG. 5j illustrates, by way of example, a top view composite SAW die depicting the $SiO_2$ seal 28 formed from the layer 42 around the perimeter of the SAW die 12 to form a non-conductive seal. A hermetically sealed composite SAW device structure 12 is formed by fusion bonding of the composite SAW die structure/wafer 12 with the Si cap structure 20, as illustrated with reference to FIG. 5g. Input and output pads 26 of the SAW transducers are connected to the signal pads 36 of the capped wafer, the cap substrate 20, through the plate vias 32 forming solder bumps 44 that are used for the connection at a printed circuit board (PCB) level 46, as illustrated with reference to FIGS. 5h and 5i, and again to FIG. 5. Individual SAW composite devices are then obtained through the cutting 30 along the center of the seal pads 28, thus resulting in the second embodiment of the filter 11 described earlier with reference to FIG. 5. As before, the composite SAW die 12 is directly bonded to a Si substrate which has the same CTE as that of the carrier substrate thereby maintaining the desirable temperature characteristics and yet exhibiting a low and small size profile.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A SAW filter comprising:
 a carrier substrate having a coefficient of thermal expansion;
 a piezoelectric substrate bonded to the carrier substrate, the coefficient of thermal expansion of the carrier substrate being less than a coefficient of thermal expansion of the piezoelectric substrate;
 an interdigital transducer pattern carried on a surface of the piezoelectric substrate, the interdigital transducer pattern in combination with the piezoelectric substrate and the carrier substrate forming a composite SAW die structure; and
 a cap substrate bonded to the piezoelectric substrate for enclosing the interdigital transducer, the cap substrate having a coefficient of thermal expansion similar to the coefficient of thermal expansion of the carrier substrate, wherein a metallic sealing pad formed on the surface of the piezoelectric substrate bonds the composite SAW die structure to the cap substrate.

2. A SAW filter according to claim 1, wherein the interdigital transducer pattern includes input/output pads enclosed therewith, the input/output pads connected to external signal pads through a metallized via extending through the cap structure.

3. A SAW filter according to claim 1, wherein an electrically non-conductive sealing pad formed on the surface of the piezoelectric substrate bonds the composite SAW die structure to the cap substrate.

4. A SAW filter according to claim 3, wherein the electrically non-conductive sealing pad is formed from a silicon dioxide material.

5. A SAW filter according to claim 1, wherein the cap structure and the carrier structure are formed from a silicon material.

6. A SAW filter according to claim 1, wherein the piezoelectric material is Lithium Tantalate.

7. A SAW filter comprising:
 a carrier substrate having a coefficient of thermal expansion;
 a piezoelectric substrate bonded to the carrier substrate, the coefficient of thermal expansion of the carrier substrate being less than a coefficient of thermal expansion of the piezoelectric substrate;
 an interdigital transducer pattern carried on a surface of the piezoelectric substrate, the interdigital transducer pattern in combination with the piezoelectric substrate and the carrier substrate forming a composite SAW die structure; and
 a cap substrate bonded to the piezoelectric substrate for enclosing the interdigital transducer, the cap substrate having a coefficient of thermal expansion similar to the coefficient of thermal expansion of the carrier substrate, wherein the interdigital transducer pattern includes input/output pads connected to external signal pads through a metallized via extending through the cap structure, and wherein an electrically non-conductive sealing material extends around a periphery of transducer finger elements of the interdigital transducers with the input/output pads extending outside the sealed transducer finger elements.

8. A SAW filter according to claim 7, wherein the electrically non-conductive sealing material is a silicon dioxide material.

9. A SAW Filter comprising:
 a piezoelectric substrate bonded to a carrier substrate, a coefficient of thermal expansion of the carrier substrate being less than a coefficient of thermal expansion of the piezoelectric substrate;
 interdigital transducers formed on a surface of the piezoelectric substrate, the interdigital transducers in combination with the piezoelectric substrate and the carrier substrate forming a composite SAW die structure, the interdigital transducers operable for generating or detecting surface acoustic waves;
 a cap substrate bonded to the piezoelectric substrate for enclosing the interdigital transducers, the cap substrate having a coefficient of thermal expansion similar to the coefficient of thermal expansion of the carrier substrate;
 signal pads formed on the capped substrate, the signal pads directly connected to at least one of input and output pads of the interdigital transducers; and
 a metallic sealing pad formed on the surface of the piezoelectric substrate for bonding the composite SAW die structure to the cap substrate.

10. A SAW filter according to claim 9, wherein the cap structure and the carrier structure are formed from a silicon material, and wherein the piezoelectric material is Lithium Tantalate.

11. A SAW Filter comprising:
a piezoelectric substrate bonded to a carrier substrate, a coefficient of thermal expansion of the carrier substrate being less than a coefficient of thermal expansion of the piezoelectric substrate;
interdigital transducers formed on the surface of the piezoelectric substrate, the interdigital transducer in combination with the piezoelectric substrate and the carrier substrate forming a composite SAW die structure, the interdigital transducers operable for generating or detecting surface acoustic waves;
a cap substrate bonded to the composite die structure, the cap structure having a coefficient of thermal expansion similar to the coefficient of thermal expansion of the carrier substrate;
signal pads are directly connected to at least one of input and output pads of the interdigital transducer, wherein the input/output pads are formed outside an enclosed portion of the composite SAW die structure provided by the sealing pad; and
a non-conductive sealing pad formed on the surface of the piezoelectric substrate for bonding the composite SAW die structure to the cap substrate.

12. A SAW filter according to claim 11, wherein the electrically non-conductive sealing material is a silicon dioxide material.

13. A SAW filter according to claim 11, wherein the cap structure and the carrier structure are formed from a silicon material.

14. A SAW filter according to claim 11, wherein the piezoelectric material is Lithium Tantalate.

15. A method of manufacturing SAW filters, the method comprising:
bonding a piezoelectric substrate to a carrier substrate formed of a material having a coefficient of thermal expansion that is significantly less than that of the piezoelectric substrate;
patterning a plurality of SAW transducers on a surface of the piezoelectric substrate through a first level metallization, the SAW transducers in combination with the piezoelectric substrate and the carrier substrate forming a composite SAW die structure;
applying and patterning a second level metallization on a surface of the piezoelectric substrate for defining input/out pads and perimeter sealing pads extending around selected SAW transducers;
partially cutting the composite SAW die structure by cutting through the perimeter sealing pads and the piezoelectric substrate;
providing a cap substrate made of material having a coefficient of thermal expansion similar to that of the carrier substrate;
patterning the cap substrate to form signal and sealing pads for each of the plurality of SAW transducers;
bonding the SAW die composite structure to the capped wafer through the sealing pads;
connecting the signal pads of the capped substrate therethrough to at least one of the input/output pads of the interdigital transducers; and
cutting the cap and composite SAW die structure for forming discrete bonded SAW filters.

16. A method according to claim 15, wherein the cap bonding comprises bonding a patterned cap substrate to the composite SAW die structure by reflowing solder in an inert atmosphere so as to hermetically seal the SAW transducer within an enclosed package of the SAW filter.

17. A SAW filter according to claim 15, wherein the cap structure and the carrier structure are formed from a silicon material.

18. A SAW filter according to claim 15, wherein the piezoelectric material is Lithium Tantalate.

19. A method of manufacturing a wafer level packaged SAW filter, the method comprising:
bonding a piezoelectric substrate to a carrier substrate formed of a material having a coefficient of thermal expansion that is significantly less than a coefficient of thermal expansion of the piezoelectric substrate;
patterning SAW transducers on a surface of the piezoelectric substrate, the SAW transducers in combination with the piezoelectric substrate and the carrier substrate forming a composite SAW die structure;
forming input/output pads and an electrically non-conducting sealing pad on a surface of the piezoelectric substrate;
providing a cap substrate made of material having a coefficient of thermal expansion similar to the coefficient of thermal expansion of the carrier substrate;
bonding the piezoelectric substrate to the cap substrate through the electrically non-conducting sealing pad;
patterning the cap substrate to form signal pads thereon;
connecting the signal pads to at least one of input/output pads of the transducers; and
partially cutting the composite SAW die structure.

20. A method according to claim 19, wherein the electrically non-conducting sealing pad forming comprises depositing a silicon dioxide layer onto the composite SAW die structure.

21. A method of manufacturing a wafer level packaged SAW filter, the method comprising:
bonding a piezoelectric substrate to a carrier substrate formed of a material having a coefficient of thermal expansion that is significantly less than a coefficient of thermal expansion of the piezoelectric substrate;
patterning SAW transducers on a surface of the piezoelectric substrate, the SAW transducers in combination with the piezoelectric substrate and the carrier substrate forming a composite SAW die structure;
forming input/output pads and an electrically non-conducting sealing pad on a surface of the piezoelectric substrate;
providing a cap substrate made of material having a coefficient of thermal expansion similar to the coefficient of thermal expansion of the carrier substrate;
bonding the piezoelectric substrate to the cap substrate through the electrically nonconducting sealing pad;
patterning the cap substrate to form signal pads thereon;
connecting the signal pads to at least one of input/output pads of the transducers, wherein the signal pad connecting comprises etching vias through the cap substrate, plating the vias, and forming solder bumps therein.

22. A SAW filter comprising:
a carrier substrate having a coefficient of thermal expansion;
a piezoelectric substrate bonded to the carrier substrate, the coefficient of thermal expansion of the carrier substrate being less than a coefficient of thermal expansion of the piezoelectric substrate;
first and second metallization patterns carried on a surface of the piezoelectric substrate, the first metallization pattern providing an interdigital transducer pattern and the second metallization pattern providing at least one of a sealing pad and a signal pad, wherein the metallization patterns in combination with the piezoelectric substrate and the carrier substrate form a composite SAW die structure; and a cap substrate bonded to the piezoelectric substrate for enclosing the interdigital transducer pattern, the cap substrate having a coefficient of thermal expansion similar to the coefficient of thermal expansion of the carrier substrate.

23. A SAW filter according to clam 22, further comprising a sealing pad formed between the piezoelectric substrate and the cap substrate.

24. A SAW filter according to claim 22, wherein the cap substrate and the carrier substrate are formed from a silicon material.

25. A SAW filter according to claim 22, wherein the piezoelectric material is Lithium Tantalate.

* * * * *